United States Patent
Kim et al.

(10) Patent No.: US 10,483,955 B2
(45) Date of Patent: Nov. 19, 2019

(54) FEEDBACK SYSTEM AND METHOD OF OPERATING THE SAME

(71) Applicant: SK hynix Inc., Gyeonggi-do (KR)

(72) Inventors: Dong Hyun Kim, Gyeonggi-do (KR); Soon Ku Kang, Gyeonggi-do (KR); Bo Ram Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/030,013

(22) Filed: Jul. 9, 2018

(65) Prior Publication Data
US 2019/0158081 A1 May 23, 2019

(30) Foreign Application Priority Data
Nov. 20, 2017 (KR) .......... 10-2017-0154519

(51) Int. Cl.
| H03K 5/13 | (2014.01) |
| H03L 7/06 | (2006.01) |
| H03K 5/1534 | (2006.01) |
| H03L 7/089 | (2006.01) |
| H03K 19/00 | (2006.01) |

(52) U.S. Cl.
CPC .......... *H03K 5/1534* (2013.01); *H03K 5/13* (2013.01); *H03K 19/0005* (2013.01); *H03L 7/089* (2013.01)

(58) Field of Classification Search
CPC .... H03K 5/1534; H03K 5/13; H03K 19/0005; H03L 7/089
See application file for complete search history.

(56) References Cited

U.S. PATENT DOCUMENTS

| 6,927,635 B2* | 8/2005 | Miki .............. H03L 7/095 331/1 A |
| 7,183,861 B2* | 2/2007 | Jung .............. H03L 7/0891 331/1 A |

FOREIGN PATENT DOCUMENTS

| KR | 1020040104968 | 12/2004 |
| KR | 1020080002692 | 1/2008 |

* cited by examiner

*Primary Examiner* — Dinh T Le
(74) *Attorney, Agent, or Firm* — IP & T Group LLP (57) ABSTRACT

The feedback system includes an input signal generation circuit configured to output an input signal having a level corresponding to a code signal inputted thereto and a lock signal generation circuit configured to output the code signal for controlling a level of the input signal using two reference signals, to generate count data acquired by counting time from when the level of the input signal reaches between levels of the two reference signals to when the level of the input signal becomes higher or lower than the level of any one of the two reference signals, and to output a lock signal for fixing the level of the input signal after time corresponding to a rounded value of a quotient of the count data divided by 2.

20 Claims, 7 Drawing Sheets

FEEDBACK SYSTEM AND METHOD OF OPERATING THE SAME

CROSS-REFERENCE TO RELATED APPLICATION

The present application claims priority under 35 U.S.C. § 119(a) to Korean patent application number 10-2017-0154519, filed on Nov. 20, 2017, which is incorporated herein by reference in its entirety.

BACKGROUND

1. Field of Invention

Various embodiments of the present disclosure generally relate to an electronic device, and more particularly, to a feedback system and a method of operating the feedback system.

2. Description of Related Art

Semiconductor integrated circuits may use a feedback control method in which a target value is compared with a previously outputted value and control is performed using the result of the comparison as feedback in order to acquire or maintain a desired output. Typical examples of digital feedback systems include a phase-locked loop circuit, a delay-locked loop circuit, a ZQ calibration circuit, and the like.

In digital feedback systems, a target value signal to be compared with an output signal may vary due to various reasons, in which case a dead zone may appear in the output signal. Accordingly, it is necessary to eliminate the dead zone in order to guarantee an accurate output level. Meanwhile, a phase-locked loop circuit, a delay-locked loop circuit, a ZQ calibration circuit, or the like may be included in a nonvolatile memory device.

Nonvolatile memories include a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

SUMMARY

Various embodiments of the present disclosure are directed to a feedback system, which is capable of eliminating a dead zone and has a reduced resolution error, and a method of operating the feedback system.

In accordance with an embodiment of the present disclosure a lock signal generation circuit is provided. The lock signal generation circuit may include an input signal control circuit configured to receive an input signal and two reference signals and output state signals and a code signal for controlling a level of the input signal, the state signals representing a result of comparison of the level of the input signal with levels of the two reference signals, a pre-lock signal generator configured to receive an up/down signal, among the state signals, and to output a pre-lock signal to be used to decide a time at which the level of the input signal is to be fixed in response to the up/down signal, the up/down signal representing whether the input signal has a higher or lower level than the two reference signals and a signal-processing circuit configured to receive the pre-lock signal and an ambiguous signal, among the state signals, and to output a lock signal for controlling the input signal to fix the level of the input signal using the ambiguous signal and the pre-lock signal, the ambiguous signal being outputted when the level of the input signal is in between the levels of the two reference signals.

Another embodiment of the present disclosure is directed to a feedback system. The feedback system may include an input signal generation circuit configured to output an input signal having a level corresponding to a code signal inputted thereto and a lock signal generation circuit configured to output the code signal for controlling a level of the input signal using two reference signals, to generate count data acquired by counting time from when the level of the input signal reaches between levels of the two reference signals to when the level of the input signal becomes higher or lower than the level of any one of the two reference signals, and to output a lock signal for fixing the level of the input signal after time corresponding to a rounded value of a quotient of the count data divided by 2.

These and other features and advantages of the present invention will become apparent to those with ordinary skill in the art to which the present invention belongs from the following description in conjunction with the accompanying drawings.

DETAILED DESCRIPTION

The particular structural or functional descriptions of embodiments in accordance with the concepts of the present disclosure in this specification or application are only intended for the purpose of describing embodiments in accordance with the concepts of the present disclosure, and the embodiments in accordance with the concepts of the present disclosure may be practiced in various forms and should not be construed as being limited to those described in the specification or the application.

Because embodiments in accordance with the concepts of the present disclosure may take different forms and include various modifications, particular embodiments will be illustrated in the drawings and described in the specification or application as a way of example. However, it is not intended to limit the embodiments in accordance with the concepts of the present disclosure to a particular form, and should be understood that the present disclosure is intended to cover all embodiment and modifications, equivalents, and/or replacements thereof that fall within the spirit and technical scope of the present disclosure.

Although terms, such as "first" and/or "second", may be used to describe various components, these components should not be limited by these terms. These terms may be named only for the purpose of distinguishing one component from another component, e.g., a first component may be named as a second component without departing from the scope of right in accordance with the concepts of the present disclosure, and similarly, a second component may also be named as a first component.

When a component is referred to as being "connected" or "coupled" to another component, it should be understood that the former can be directly connected or coupled to the latter, or another component may be present in therebetween. On the contrary, when a component is referred to as being "directly connected" or "directly coupled" to another component, it should be understood that no other component is present therebetween. Other expressions describing the relationship between components, such as "between" and "directly between" or "adjacent to" and "adjacent directly to" should be also construed in the same way.

The terms used herein are only used to describe specific embodiments and not intended to limit the present disclosure. The terms in singular form may include the plural form unless otherwise specified. It should be understood that the terms "includes" or "has" indicate the presence of characteristics, numbers, steps, operations, components, parts or combinations thereof represented in the specification but do not exclude the presence or addition of one or more other characteristics, numbers, steps, operations, components, parts or combinations thereof.

Unless otherwise defined herein, all terms used herein including technical or scientific terms have the same meanings as those generally understood by a person skilled in the art. Terms defined in dictionaries and generally used should be construed to have meanings matching with contextual meanings in the related art, and are not construed as an ideal or excessively formal meaning unless otherwise defined herein.

In the embodiments, detailed descriptions of the technical content that is well-known and is not directly related to the present disclosure will be omitted. Such an omission of unnecessary descriptions is intended to prevent the gist of the present disclosure from being obscure and to fully reveal the gist of the present disclosure.

Hereinafter, embodiments of the present disclosure are described with reference to the accompanying drawings in order to describe the present disclosure in detail so that those having ordinary knowledge in the technical field to which the present disclosure pertains can easily practice the present disclosure.

Figure 1:
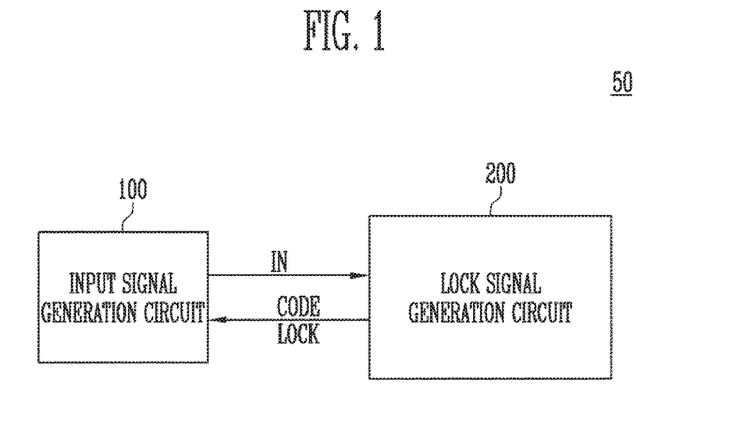
FIG. 1 is a simplified diagram illustrating a feedback system in accordance with an embodiment of the present disclosure.

FIG. 1 is a simplified diagram illustrating a feedback system in accordance with an embodiment of the present disclosure.

Referring to FIG. 1, the feedback system 50 may include an input signal generation circuit 100 and a lock signal generation circuit 200.

The input signal generation circuit 100 may receive a code signal CODE from the lock signal generation circuit 200. The input signal generation circuit 100 may generate an input signal and output the input signal IN corresponding to the code signal CODE to the lock signal generation circuit 200. In an embodiment the code signal CODE may be either an up-code signal or a down-code signal.

When an up-code signal is inputted, the input signal generation circuit 100 may generate and output an input signal IN having a level that is higher than the level of a previously outputted input signal IN to the lock signal generation circuit 200. For example, when an up-code signal is inputted, the input signal generation circuit 100 may generate and output an input signal IN having a level that is 1 code higher than the level of a previously outputted input signal IN to the lock signal generation circuit 200. When a down-code signal is inputted, the input signal generation circuit 100 may output an input signal IN having a level that is lower than the level of a previously outputted input signal IN to the lock signal generation circuit 200. For example, when a down-code signal is inputted, the input signal generation circuit 100 may output an input signal IN having a level that is 1 code lower than the level of a previously outputted input signal IN to the lock signal generation circuit 200.

The input signal generation circuit 100 may receive a lock signal LOCK from the lock signal generation circuit 200. When the lock signal LOCK is inputted to the input signal generation circuit 100, the input signal generation circuit 100 may maintain and output the previous state of the input signal IN.

The lock signal generation circuit 200 may receive an input signal IN from the input signal generation circuit 100. The lock signal generation circuit 200 may output a code signal CODE in order to make the input signal IN reach a target level. The lock signal generation circuit 200 may output an up-code signal to the input signal generation circuit 100 in order to raise the level of the input signal IN when the level of the input signal IN is lower than the target level. Alternatively, the lock signal generation circuit 200 may output a down-code signal to the input signal generation circuit 100 in order to lower the level of the input signal IN when the level of the input signal IN is higher than the target level.

The lock signal generation circuit 200 may output a lock signal LOCK to the input signal generation circuit 100 when there is no need to change the level of the input signal IN. For example, the lock signal generation circuit 200 may output the lock signal LOCK when the input signal IN reaches the target level.

The feedback system 50 shown in FIG. 1 may be applied to various analog or digital circuits. For example, the lock signal generation circuit 200 may be used to control the input signal IN, outputted by the input signal generation circuit 100, such that the input signal IN has a specific level or the level thereof has a value within a specific range. The input signal generation circuit 100 may be an analog or digital circuit for generating an input signal IN having a different level from a previously generated input signal. In an embodiment, the input signal generation circuit 100 may be a digital circuit for generating an input signal IN having a different level from a previously generated input signal. In an embodiment, the lock signal generation circuit 200 may be a lock detector circuit.

Figure 2:
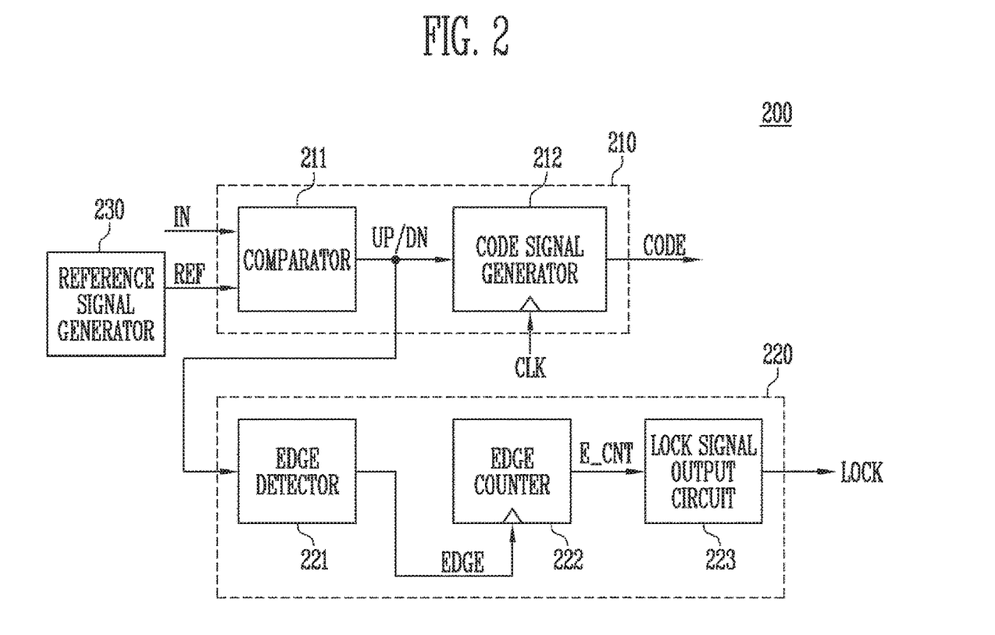
FIG. 2 is a diagram illustrating an example of the lock signal generation circuit shown in FIG. 1.

FIG. 2 is a diagram illustrating a first embodiment of the lock signal generation circuit 200 in FIG. 1.

Referring to FIG. 2, the lock signal generation circuit 200 may include an input signal control circuit 210 and a signal-processing circuit 220. The lock signal generation circuit 200 includes a reference signal generator for generating a reference signal REF.

The input signal control circuit 210 may receive an input signal IN and a reference signal REF. The input signal control circuit 210 may compare the input signal IN with the reference signal REF and output an up/down signal UP/DN and a code signal CODE.

The input signal control circuit 210 may include a comparator 211 and a code signal generator 212.

The comparator 211 may receive an input signal IN and a reference signal REF. The comparator 211 may output an up/down signal UP/DN after comparing the input signal IN with the reference signal REF. For example, the comparator 211 may output an up/down signal UP/DN having a high state when the input signal IN has a lower level than the reference signal REF. Alternatively, the comparator 211 may output an up/down signal UP/DN having a low state when the input signal IN has a higher level than the reference signal REF. The outputted up/down signal UP/DN may be provided to the code signal generator 212 and the signal-processing circuit 220.

The code signal generator 212 may receive the up/down signal UP/DN from the comparator 211. The code signal generator 212 may generate a code signal depending on the up/down signal UP/DN. In an embodiment the code signal CODE may be either an up-code signal or a down-code signal.

Specifically, the code signal generator 212 may output an up-code signal when the up/down signal UP/DN having a high state is inputted. Alternatively, the code signal generator 212 may output a down-code signal when the up/down signal UP/DN having a low state is inputted. Hence, the input signal control circuit 210 may output an up-code or a down-code signal CODE depending upon he level of the input signal IN received from the input signal generation unit 100.

The signal-processing circuit 220 may receive the up/down signal UP/DN outputted from the comparator 211. The signal-processing circuit 220 may generate a lock signal LOCK based on the up/down signal UP/DN and output the generated lock signal LOCK.

The signal-processing circuit 220 may include an edge detector 221, an edge counter 222, and a lock signal output circuit 223.

The edge detector 221 may receive an up/down signal UP/DN. The edge detector 221 may detect that the up/down signal UP/DN changes from a high state to a low state or from a low state to a high state. For example, the edge detector 221 may detect a falling edge at which the up/down signal UP/DN changes from a high state to a low state or a rising edge at which the up/down signal UP/DN changes from a low state to a high state, and may output an edge detection signal EDGE to the edge counter 222 whenever it detects the falling edge or the rising edge.

The edge counter 222 may receive the edge detection signal EDGE from the edge detector 221. The edge counter 222 may count the number of edge detection signals EDGE inputted thereto. The edge counter 222 may output an edge count signal E_CNT to the lock signal output circuit 223 when the number of edge detection signals EDGE inputted thereto reaches a preset reference number. For example, the edge counter 222 may output the edge count signal E_CNT when the edge count signal EDGE is inputted twice. However, it is noted that this is just an example and that, in the embodiment shown in FIG. 2, the number of edge detection signals EDGE detected by the edge counter 222 in order for the edge count signal E_CNT to be outputted may be set to a different number.

The lock signal output circuit 223 may receive the edge count signal E_CNT. In response to the edge count signal E_CNT, the lock signal output circuit 223 may generate a lock signal LOCK and output the generated lock signal LOCK.

Figure 3:
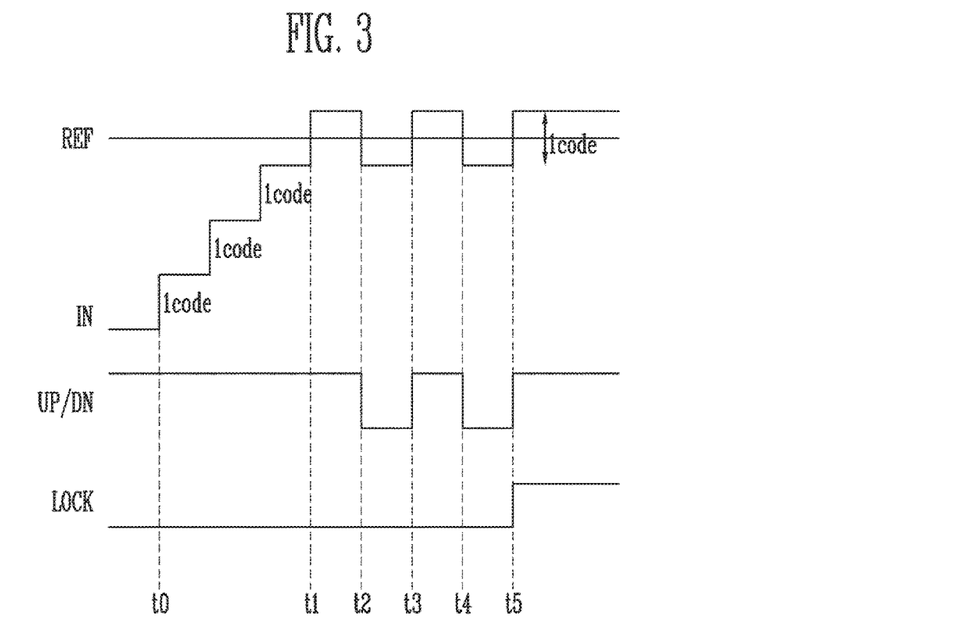
FIG. 3 is a timing diagram of an operation of the lock signal generation circuit shown in FIG. 2.

FIG. 3 is an exemplary timing diagram of an operation of the lock signal generation circuit 200 in accordance with the embodiment shown in FIG. 2.

Referring to FIG. 2 and FIG. 3, the lock signal generation circuit 200 may receive an input signal IN, and may output a lock signal LOCK to the input signal generation circuit 100 when there is no need to change the level of the input signal IN after the input signal IN reaches the level of a reference signal REF.

Specifically, an input signal IN is inputted at t0. Because the input signal IN has a lower level than the reference signal REF at t0, the input signal IN may reach the level of the reference signal only when the level of the input signal IN increases. Accordingly, the comparator 211 outputs an up/down signal UP/DN having a high state as the result of comparison of the input signal IN with the reference signal REF. The code signal generator 212 that receives the up/down signal UP/DN, which is outputted by the comparator 211, may output an up-code signal as a code signal because the up/down signal UP/DN has the high state. The input signal generation circuit 100 may then adjust the previous input signal IN so as to now have a level that is 1 code higher than before in response to the up-code signal CODE received from the code signal generator 212 of the lock signal generation circuit 200.

Because the input signal IN has a lower level than the reference signal REF from t0 to t1, the up/down signal UP/DN outputted by the comparator 211 maintains the high state. Also, because the code signal generator 212 outputs an up-code signal CODE in response to the up/down signal UP/DN having the high state, the level of the input signal IN may increase by 1 code.

At t2, the input signal IN has a higher level than the reference signal REF. Accordingly, the comparator 211 may output an up/down signal UP/DN having a low state. Also, in response to the up/down signal UP/DN having the low state, the code signal generator 212 may output a down-code signal CODE. Hence, the input signal IN may be adjusted so as to have a level that is one code lower than before in response to the down-code signal.

The edge detector 221 may detect a falling edge because the up/down signal UP/DN changes from the high state to the low state at t2. The edge detector 221 may output an edge detection signal EDGE to the edge counter 222 (not illustrated).

At t3, the input signal IN has a lower level than the reference signal REF. Accordingly, the comparator 211 may output an up/down signal UP/DN having a high state. Also, in response to the up/down signal UP/DN having the high state, the code signal generator 212 may output an up-code signal CODE. The input signal IN may then be adjusted so as to have a level that is 1 code higher than before in response to the up-code signal CODE.

At t3, the edge detector 221 may detect a rising edge because the up/down signal UP/DN changes from the low state to the high state. The edge detector 221 may output an edge detection signal EDGE to the edge counter 222 (not illustrated).

At t4, the input signal IN has a higher level than the reference signal REF. Accordingly, the comparator 211 may output an up/down signal UP/DN having a low state. Also, in response to the up/down signal UP/DN having the low state, the code signal generator 212 may output a down-code signal CODE. The input signal IN may be adjusted so as to have a level that is 1 code lower than before in response to the down-code signal.

At t4, the edge detector 221 may detect a falling edge because the up/down signal UP/DN changes from the high state to the low state. The edge detector 221 may output an edge detection signal EDGE to the edge counter 222 (not illustrated in FIG. 3).

At t5, the input signal IN has a lower level than the reference signal REF. Accordingly, the comparator 211 may output an up/down signal UP/DN having a high state. Also, in response to the up/down signal UP/DN having the high state, the code signal generator 212 may output an up-code signal CODE. The input signal IN may be adjusted so as to have a level that is 1 code higher than before in response to the up-code signal.

At t5, the edge detector 221 may detect a rising edge because the up/down signal UP/DN changes from the low state to the high state at t5. The edge detector 221 may output an edge detection signal EDGE to the edge counter 222 (not illustrated).

In the embodiment of FIG. 3, the edge counter 222 is assumed to output an edge count signal E_CNT when the edge detection signal EDGE is inputted four times. However, this is just one example, and the invention is not limited in this way. For example, the edge counter 222 may output the edge count signal E_CNT when the edge detection signal EDGE is inputted twice or more times depending on design. In the illustrated embodiment of FIG. 3 when the edge counter 222 receives the edge detection signal EDGE four times, it may then output the edge count signal E_CNT to the lock signal output circuit 223. The lock signal output circuit 223 may output a lock signal LOCK in response to the edge count signal E_CNT.

In response to the output of the lock signal LOCK, the input signal generation unit 100 will maintain the level of the input signal IN without change.

In the case of the lock signal generation circuit 200 in accordance with the embodiment of FIG. 2 and FIG. 3, when the difference between the level of the input signal IN and the level of the reference signal REF is less than 1 code, the high-to-low and low-to-high transition of the up/down signal UP/DN is repeated (bang-bang). The lock signal generation circuit 200 has a structure in which a lock signal LOCK is generated by detecting the repeated high-to-low and low-to-high transition of the up/down signal UP/DN. The lock signal generation circuit 200 in accordance with the embodiment of FIG. 2 and FIG. 3 may be referred to as a bang-bang lock detector.

In the feedback system using a bang-bang detector in accordance with the embodiment of FIG. 2 and FIG. 3, there may be a resolution error of ±1 code level between the reference signal REF and the input signal IN. In order to decrease such an error, a lock detector circuit using two reference signals will be described below with reference to FIG. 4 and FIG. 5.

Figure 4:
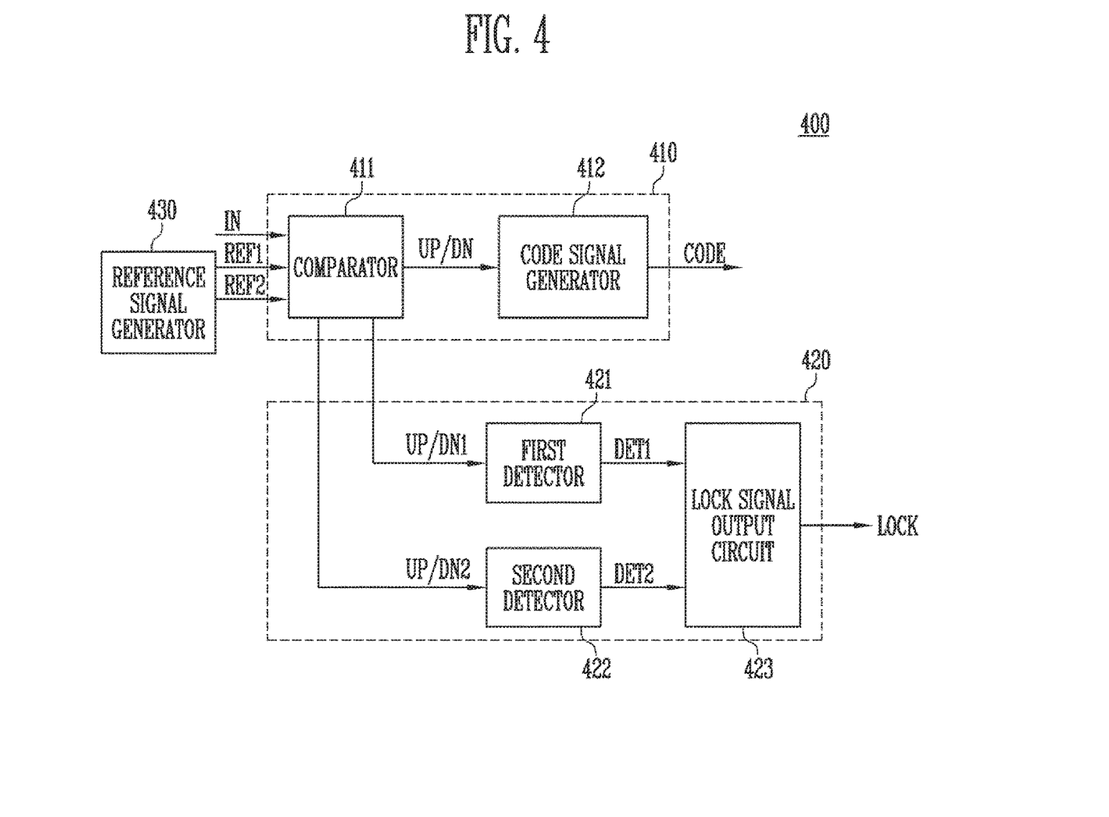
FIG. 4 is a diagram illustrating an example of the lock signal generation circuit shown in FIG. 1.

FIG. 4 is a diagram illustrating an embodiment of the lock signal generation circuit shown in FIG. 1.

The lock signal generation circuit 400 in FIG. 4 may include an input signal control circuit 410 and a signal-processing circuit 420. The lock signal generation circuit 400 includes a reference signal generator 430 for generating reference signals REF1 and REF2.

The input signal control circuit input signal control circuit 410 may receive an input signal IN and two reference signals, which are a first reference signal REF1 and a second reference signal REF2, and output a first sub-up/down signal UP/DN1, a second sub-up/down signal UP/DN2, and a code signal CODE after comparing the input signal IN with the two reference signals.

In the embodiment of FIG. 4, the first reference signal REF1 is assumed to have a higher level than the second reference signal REF2.

The input signal control circuit 410 may include a comparator 411 and a code signal generator 412.

The comparator 411 may receive an input signal IN, a first reference signal REF1, and a second reference signal REF2. The comparator 411 may compare the input signal IN with the first reference signal REF1 and the second reference signal REF2. Specifically, the comparator 411 may compare the input signal IN with the first reference signal REF1 and the second reference signal REF2 and output a main up/down signal UP/DN, a first sub-up/down signal UP/DN1, and a second sub-up/down signal UP/DN2 depending on the result of comparison.

For example, the comparator 411 may output a main up/down signal UP/DN having a high state when the input signal IN has a lower level than the second reference signal REF2. The comparator 411 may output a main up/down signal UP/DN having a low state when the input signal IN has a higher level than the first reference signal REF1. The comparator 411 may maintain the previous state of the main up/down signal UP/DN without change when the level of the input signal IN is higher than the level of the second reference signal REF2 and lower than the level of the first reference signal REF1. That is, the main up/down signal UP/DN has a high state when the level of the input signal IN is lower than the levels of the first reference signal REF1 and the second reference signal REF2, has a low state when the level of the input signal IN is higher than the levels of the first reference signal REF1 and the second reference signal REF2, or maintains the previous state when the level of the input signal IN is in between the levels of the first reference signal REF1 and the second reference signal REF2.

In the illustrated embodiment, the comparator 411 may output a first sub-up/down signal UP/DN1 depending on the result of comparison of the input signal IN with the first reference signal REF1. For example, the comparator 411 outputs the first sub-up/down signal UP/DN1 having a high state when the input signal IN has a lower level than the first reference signal REF1. The comparator 411 outputs the first sub-up/down signal UP/DN1 having a low state when the input signal IN has a higher level than the first reference signal REF1.

In an embodiment the comparator 411 may output a second sub-up/down signal UP/DN2 depending on the result of comparison of the input signal IN with the second reference signal REF2. For example, the comparator 411 outputs the second sub-up/down signal UP/DN2 having a high state when the input signal IN has a lower level than the second reference signal REF2. The comparator 411 outputs the second sub-up/down signal UP/DN2 having a low state when the input signal IN has a higher level than the second reference signal REF2.

The comparator 411 may output the main up/down signal UP/DN to the code signal generator 412.

The comparator 411 may output the first sub-up/down signal UP/DN1 and the second sub-up/down signal UP/DN2 to the signal-processing circuit 420.

The code signal generator 412 may receive the main up/down signal UP/DN from the comparator 411. The code signal generator 412 may generate a code signal depending on the main up/down signal UP/DN. In an embodiment the code signal CODE may be either an up-code signal or a down-code signal.

Specifically, the code signal generator 412 may output an up-code signal when the main up/down signal UP/DN having a high state is inputted thereto. Alternatively, the code signal generator 412 may output a down-code signal when the main up/down signal UP/DN having a low state is inputted thereto. Then the input signal generation circuit 100 may raise or lower the level of the input signal IN depending on the type of the outputted code signal CODE.

The signal-processing circuit 420 may receive the first sub-up/down signal UP/DN1 and the second sub-up/down signal UP/DN2 outputted from the comparator 411. The signal-processing circuit 420 may generate a lock signal LOCK based on the first sub-up/down signal UP/DN1 and the second sub-up/down signal UP/DN2 and output the generated lock signal LOCK.

The signal-processing circuit 420 may include a first detector 421, a second detector 422, and a lock signal output circuit 423.

The first detection unit 421 may receive the first sub-up/down signal UP/DN1 from the comparator 411. The first detector 421 may detect that the first sub-up/down signal UP/DN1 changes from a high state to a low state or from a low state to a high state. For example, the first detector 421 may detect a falling edge at which the first sub-up/down signal UP/DN1 changes from a high state to a low state or a rising edge at which the first sub-up/down signal UP/DN1 changes from a low state to a high state. In an embodiment the first detector 421 may output a first detection signal DET1 to the lock signal output circuit 423 when the first sub-up/down signal UP/DN1 changes as many times as a preset number. For example, when the state of the first sub-up/down signal UP/DN1 changes four times, the first detector 421 may output the first detection signal DET1 to the lock signal output circuit 423. However, this is for the convenience of description, the first detector 421 may output the first detection signal DET1 to the lock signal output circuit 423 when the state of the first sub-up/down signal UP/DN1 changes twice or more.

The second detector 422 may receive the second sub-up/down signal UP/DN2 from the comparator 411. The second detector 422 may detect that the second sub-up/down signal UP/DN2 changes from a high state to a low state or from a low state to a high state. For example, the second detector 422 may detect a falling edge at which the second sub-up/down signal UP/DN2 changes from a high state to a low state or a rising edge at which the second sub-up/down signal UP/DN2 changes from a low state to a high state. In an embodiment the second detector unit 422 may output a second detection signal DET2 to the lock signal output circuit 423 when the second sub-up/down signal UP/DN2 changes as many times as the preset number. For example, when the state of the second sub-up/down signal UP/DN2 changes four times, the second detector 422 may output the second detection signal DET2 to the lock signal output circuit 423. However, this is for the convenience of description, the second detector 422 may output the second detection signal DET2 to the lock signal output circuit 423 when the state of the second sub-up/down signal UP/DN2 changes twice or more.

The lock signal output circuit 423 may receive the first detection signal DET1 and the second detection signal DET2 from the first detector 421 and the second detector 422, respectively. The lock signal output circuit 423 may output a lock signal LOCK when both the first detection signal DET1 and the second detection signal DET2 are inputted thereto.

Figure 5:
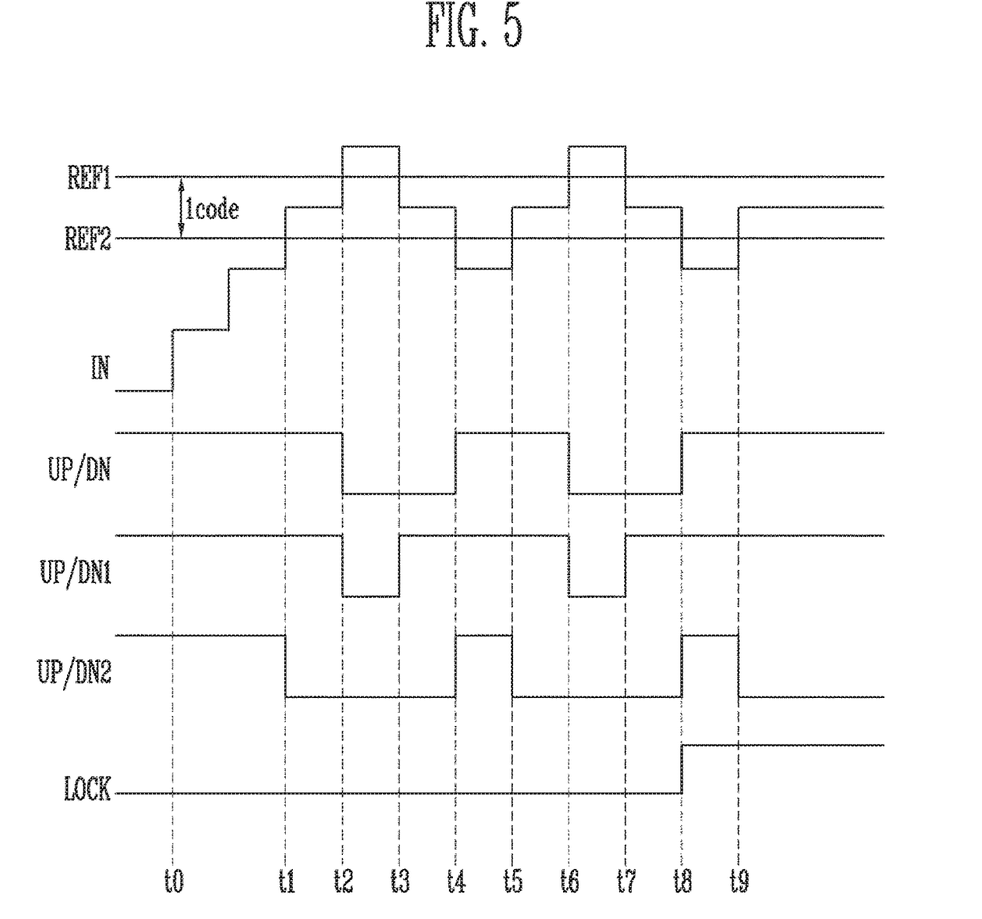
FIG. 5 is a timing diagram of an operation of the lock signal generation circuit shown in FIG. 4.

FIG. 5 is an exemplary timing diagram of an operation of the lock signal generation circuit 400 in accordance with the embodiment of FIG. 4.

Referring to FIG. 5, the lock signal generation circuit 400 may receive an input signal IN and two reference signals, which are a first reference signal REF1 and a second reference signal REF2, and output a lock signal LOCK after comparing the input signal IN with the two reference signals.

Specifically, an input signal IN is inputted at t0. At t0, the input signal IN has a lower level than the first reference signal REF1 and the second reference signal REF2. Accordingly, the comparator 411 may output a main up/down signal UP/DN having a high state as the result of comparison of the input signal IN with the first reference signal REF1 and the second reference signal REF2. Also, the comparator 411 may output a first sub-up/down signal UP/DN1 having a high state as the result of comparison of the input signal IN with the first reference signal REF1. Also, the comparator 411 may output a second sub-up/down signal UP/DN2 having a high state as the result of comparison of the input signal IN with the second reference signal REF2.

The code signal generator 412, which receives the main up/down signal UP/DN outputted by the comparator 411, may output an up-code signal CODE as a code signal because the main up/down signal UP/DN has a high state. Then, the input signal generation circuit 100 may adjust the input signal IN so as to have a level that is 1 code higher than before in response to the up-code signal CODE.

Because the input signal IN has a lower level than the first reference signal REF1 and the second reference signal REF2 from t0 to t1, the main up/down signal UP/DN, the first sub-up/down signal UP/DN1, and the second sub-up/down signal UP/DN2, outputted by the comparator 411, may maintain the high state during this time. Also, because the code signal generator 412 outputs an up-code signal in response to the main up/down signal UP/DN having the high state, the level of the input signal IN may increase by increments of 1 code during this time.

At t1, the input signal IN has a higher level than the second reference signal REF2. Accordingly, the comparator 411 may output the second sub-up/down signal UP/DN2 having a low state. Also, because the input signal IN has a lower level than the first reference signal REF1, the comparator 411 may output the first sub-up/down signal UP/DN1 having a high state. Also, although the level of the input signal IN is higher than the level of the second reference signal REF2, because the level of the input signal IN is lower than the level of the first reference signal REF1, the comparator 411 may output the main-up/down signal UP/DN having a high state, which is the same as the previous state. In response to the main up/down signal UP/DN having the high state, the code signal generator 412 may output an up-code signal CODE and the input signal generation circuit 100 may adjust the input signal IN so as to have a level that is 1 code higher than before in response to the up-code signal CODE.

At t2, the input signal IN has a higher level than the first reference signal REF1 and the second reference signal REF2. Accordingly, the comparator 411 may output the main up/down signal UP/DN, the first sub-up/down signal UP/DN1, and the second sub-up/down signal UP/DN2, each of which has a low state. In response to the main up/down signal UP/DN having the low state, the code signal generator 412 may output a down-code signal CODE and the input signal generation circuit 100 may then adjust the input signal IN so as to have a level that is 1 code lower than before in response to the down-code signal CODE.

At t3, the input signal IN has a level that is in between the levels of the first reference signal REF1 and the second reference signal REF2. Accordingly, the comparator 411 may output the main up/down signal UP/DN having a low state, which is the same as the previous state, the first sub-up/down signal UP/DN1 having a high state, and the second sub-up/down signal UP/DN2 having a low state. In response to the main up/down signal UP/DN having the low state, the code signal generator 412 may output a down-code signal CODE. The input signal IN may be adjusted so as to have a level that is 1 code lower than before in response to the down-code signal CODE.

At t4, the input signal IN has a lower level than the first reference signal REF1 and the second reference signal REF2. Accordingly, the comparator 411 may output the main up/down signal UP/DN having a high state as the result of comparison of the input signal IN with the first reference signal REF1 and the second reference signal REF2. Also, the comparator 411 may output the first sub-up/down signal UP/DN1 having a high state as the result of the comparison of the input signal IN with the first reference signal REF1. Also, the comparator 411 may output the second sub-up/down signal UP/DN2 having a high state as the result of comparison of the input signal IN with the second reference signal REF2. In response to the main up/down signal UP/DN having the high state, the code signal generator 412 may output an up-code signal. The input signal IN may be adjusted so as to have a level that is 1 code higher than before in response to the up-code signal.

At t5, the input signal IN has a level that is in between the levels of the first reference signal REF1 and the second reference signal REF2. Accordingly, the comparator 411 may output the main up/down signal UP/DN having a high state, which is the same as the previous state, the first sub-up/down signal UP/DN1 having a high state, and the second sub-up/down signal UP/DN2 having a low state. In response to the main up/down signal UP/DN having the high state, the code signal generator 412 may output an up-code signal. The input signal IN may be adjusted so as to have a level that is 1 code higher than before in response to the up-code signal.

At t6, the input signal IN has a higher level than the first reference signal REF1 and the second reference signal REF2. Accordingly, the comparator 411 may output the main up/down signal UP/DN, the first sub-up/down signal UP/DN1, and the second sub-up/down signal UP/DN2, each of which has a low state. In response to the main up/down signal UP/DN having the low state, the code signal generator 412 may output a down-code signal. The input signal IN may be adjusted so as to have a level that is 1 code lower than before in response to the down-code signal.

At t7, the input signal IN has a level that is in between the levels of the first reference signal REF1 and the second reference signal REF2. Accordingly, the comparator 411 may output the main up/down signal UP/DN having a low state, which is the same as the previous state, the first sub-up/down signal UP/DN1 having a high state, and the second sub-up/down signal UP/DN2 having a low state. In response to the main up/down signal UP/DN having the low state, the code signal generator 412 may output a down-code signal. The input signal IN may be adjusted so as to have a level that is 1 code lower than before in response to the down-code signal.

When the state of the first sub-up/down signal UP/DN1 changes from the low state to the high state at t7, because the cumulative number of changes reaches four, the first detector 421 may output the first detection signal DET1 to the lock signal output circuit 423.

At t8, the input signal IN has a lower level than the first reference signal REF1 and the second reference signal REF2. Accordingly, the comparator 411 may output the main up/down signal UP/DN having a high state as the result of comparison of the input signal IN with the first reference signal REF1 and the second reference signal REF2. Also, the comparator 411 may output the first sub-up/down signal UP/DN1 having a high state as the result of comparison of the input signal IN with the first reference signal REF1. Also, the comparator 411 may output the second sub-up/down signal UP/DN2 having a high state as the result of comparison of the input signal IN with the second reference signal REF2. In response to the main up/down signal UP/DN having the high state, the code signal generator 412 may output an up-code signal. The input signal IN may be adjusted so as to have a level that is 1 code higher than before in response to the up-code signal.

When the state of the second up/down signal UP/DN2 changes from the low state to the high state at t8, because the cumulative number of changes reaches four, the second detector 422 may output the second detection signal DET2 to the lock signal output circuit 423.

When it receives both the first detection signal DET1 and the second detection signal DET2, the lock signal output circuit 423 may generate a lock signal LOCK and output the generated lock signal LOCK.

In the embodiment using two reference signals REF1 and REF2 as illustrated in the embodiment of FIG. 4 and FIG. 5, if the difference between the levels of the first reference signal REF1 and the second reference signal REF2 can be maintained equal to 1 code, when the lock signal LOCK is outputted, the resolution error may be reduced to ±0.5 code level. However, it is difficult in practice to set the difference between the levels of the first reference signal REF1 and the second reference signal REF2 to 1 code when the lock signal generation circuit 400 is formed or under the variation of Process, Voltage, and Temperature (PVT) of semiconductor elements, to which the lock signal generation circuit 400 is applied. Also, when the difference between the levels of the first reference signal REF1 and the second reference signal REF2 is equal to or greater than 2 codes, a dead zone is generated, which exacerbates the resolution error.

Hereinafter, a lock signal generation circuit that uses two reference signals REF1 and REF2 but is capable of eliminating a dead zone will be described in detail with reference to FIGS. 6 to 9.

Figure 6:
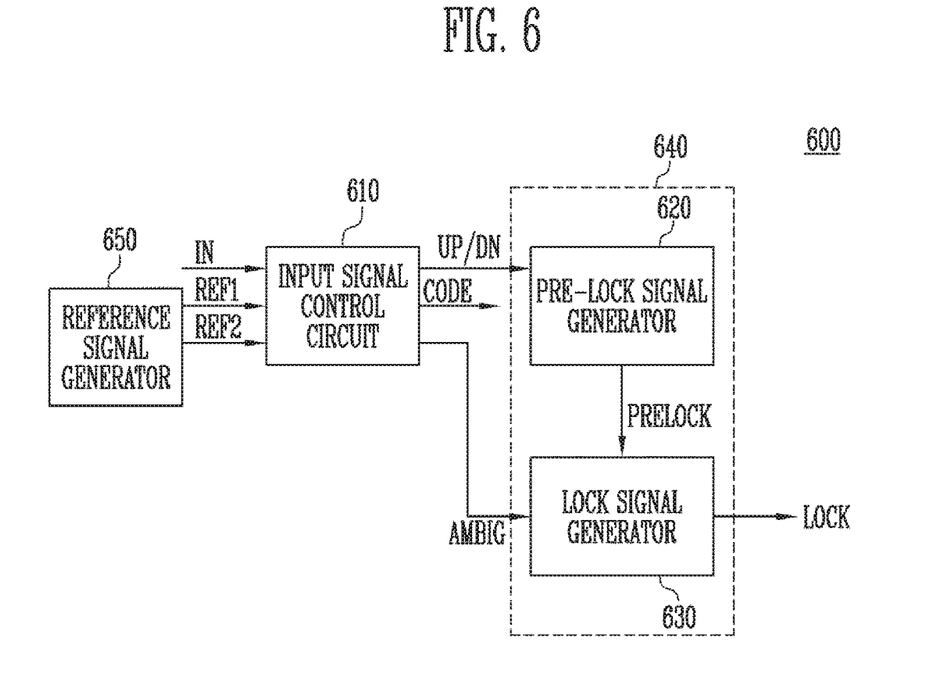
FIG. 6 is a diagram illustrating an example of the lock signal generation circuit shown in FIG. 1.

FIG. 6 is a diagram illustrating a third embodiment of the lock signal generation circuit in accordance with the embodiment of FIG. 1.

Referring to FIG. 6, the lock signal generation circuit 600 may include an input signal control circuit 610 and a signal-processing circuit 640. The lock signal generation circuit 600 includes a reference signal generator 650 for generating reference signals REF1 and REF2. The signal-processing circuit 640 includes a pre-lock signal generator 620, and a lock signal generator 630.

In the embodiments of FIGS. 6 to 9, the first reference signal REF1, is assumed to have a higher level than the second reference signal REF2.

The input signal control circuit signal control circuit 610 may receive an input signal IN, a first reference signal REF1, and a second reference signal REF2 and output an up/down signal UP/DN and an ambiguous signal AMBIG based on the result of comparison of the input signal IN with the first reference signal REF1 and the second reference signal REF2. For example, the input signal control circuit signal control circuit 610 may output an up/down signal UP/DN having a high state when the level of the input signal IN is lower than the levels of the first reference signal REF1 and the second reference signal REF2, output an up/down signal UP/DN having a low state when the level of the input signal IN is higher than the levels of the first reference signal REF1 and the second reference signal REF2, and output an ambiguous signal AMBIG when the level of the input signal IN is in between the levels of the first reference signal REF1 and the second reference signal REF2.

The input signal control circuit signal control circuit 610 may output a code signal CODE depending on the up/down signal UP/DN. In an embodiment the code signal CODE may be either an up-code signal or a down-code signal. Specifically, the input signal control circuit signal control circuit 610 may output an up-code signal in response to the up/down signal UP/DN having a high state. Alternatively, the input signal control circuit signal control circuit 610 may output a down-code signal in response to the up/down signal UP/DN having a low state. Then the input signal generation circuit 100 may raise or lower the level of the input signal IN depending on the type of the outputted code signal CODE. For example, when an up-code signal is outputted, the level of the input signal IN may increase by 1 code. Alternatively, when a down-code signal is outputted, the level of the input signal IN may decrease by 1 code.

The pre-lock signal generator0 receives the up/down signal UP/DN from the input signal control circuit signal control circuit 610. The pre-lock signal generator 620 may output a pre-lock signal PRELOCK to the lock signal generator 630 using the received up/down signal UP/DN. The detailed configuration of the pre-lock signal generation unit 620 will be described later with reference to FIG. 7.

The lock signal generator 630 may receive the ambiguous signal AMBIG from the input signal control circuit signal control circuit 610. The lock signal generator 630 may receive the pre-lock signal PRELOCK from the pre-lock signal generator 620. The lock signal generator 630 may generate and output a lock signal LOCK using the received ambiguous signal AMBIG and the received pre-lock signal PRELOCK. An exemplary detailed configuration of the lock signal generator 630 will be described with reference to FIG. 7.

Figure 7:
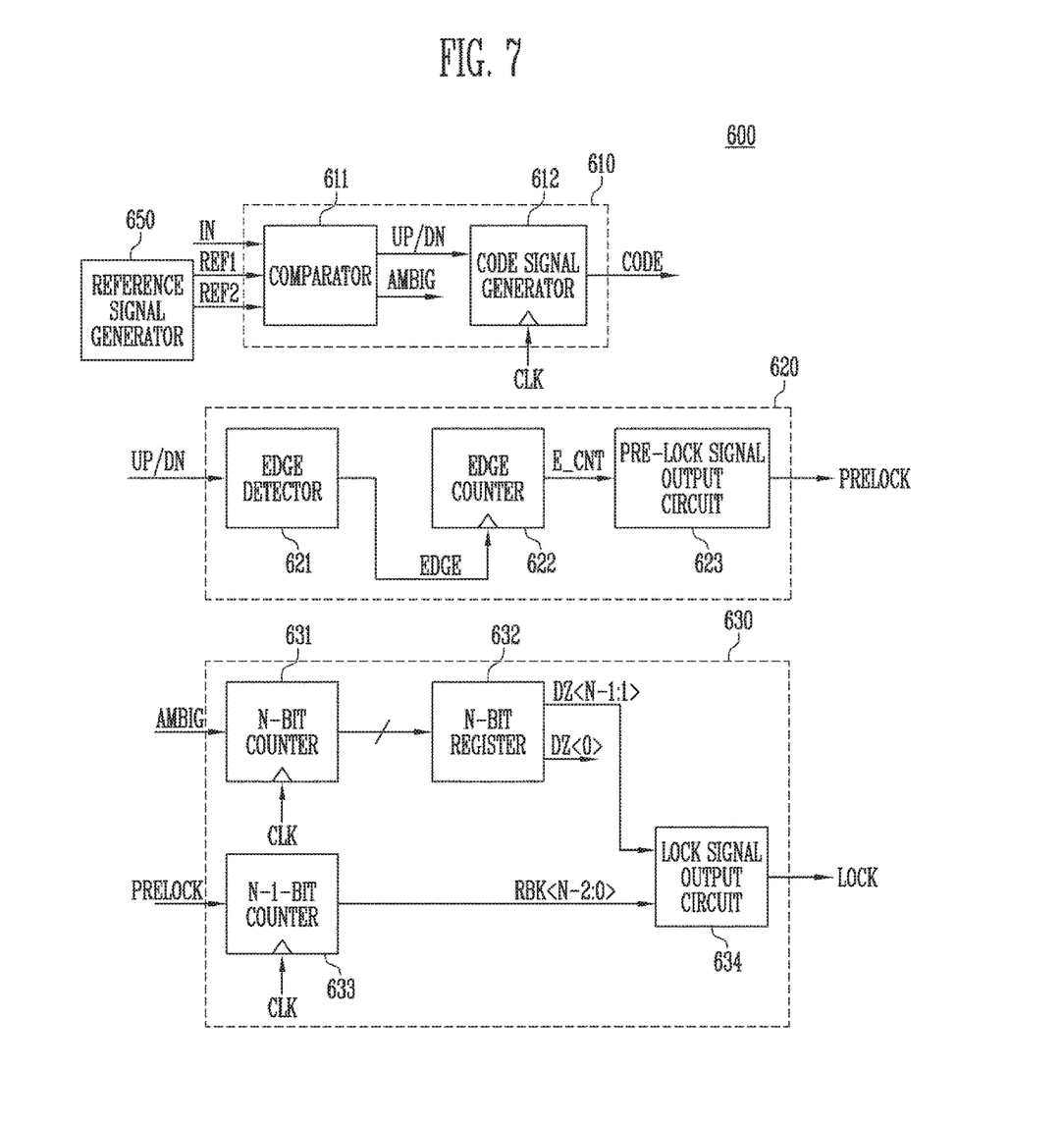
FIG. 7 is a block diagram for explaining the detailed structure of the lock signal generation circuit shown in FIG. 6.

FIG. 7 is a block diagram illustrating an exemplary structure of the lock signal generation circuit 600 in accordance with the embodiment of FIG. 6.

Referring to FIG. 7, the input signal control circuit 610 may include a comparator 611 and a code signal generator 612.

The comparator 611 may receive an input signal IN, a first reference signal REF1, and a second reference signal REF2. The comparator 611 may compare the input signal IN with the first reference signal REF1 and the second reference signal REF2. Specifically, the comparator 611 may compare the input signal IN with the first reference signal REF1 and the second reference signal REF2, and may output an up/down signal UP/DN and an ambiguous signal AMBIG based on the comparison results.

For example, the comparator 611 may output the up/down signal having a high state when the level of the input signal IN is lower than the level of the second reference signal REF2. The comparator 611 may output the up/down signal having a low state when the level of the input signal IN is higher than the level of the first reference signal REF1. The comparator 611 may output the ambiguous signal AMBIG when the level of the input signal IN is higher than the level of the second reference signal REF2 and lower than the level of the first reference signal REF1. When it outputs the ambiguous signal AMBIG, the comparator 611 may maintain the previous outputted state of the up/down signal UP/DN. Accordingly, the up/down signal UP/DN has a high state when the level of the input signal IN is lower than the levels of the first reference signal REF1 and the second reference signal REF2, has a low state when the level of the input signal IN is higher than the levels of the first reference signal REF1 and the second reference signal REF2, and maintains the previous state when the level of the input signal IN is in between the levels of the first reference signal REF1 and the second reference signal REF2.

The comparator 611 may output the up/down signal UP/DN to the code signal generator 612.

The comparator 611 may output the ambiguous signal AMBIG to the lock signal generator 630.

The code signal generator 612 may receive the up/down signal UP/DN from the comparator 611. The code signal generator 612 may generate a code signal depending on the up/down signal UP/DN. In an embodiment, the code signal CODE may be either an up-code signal or a down-code signal.

Specifically, the code signal generator 612 may output an up-code signal when the up/down signal UP/DN having a high state is inputted thereto. Alternatively, the code signal generator 612 may output a down-code signal when the up/down signal UP/DN having a low state is inputted thereto. Then, the input signal generation circuit 100 may raise or lower the level of the input signal IN depending on the type of the outputted code signal CODE. For example, the input signal IN may be controlled so as to have 1 code higher than before in response to the up-code signal. Alternatively, the input signal IN may be controlled so as to have a level that is 1 code lower than before in response to the down-code signal.

The pre-lock signal generation unit 620 may receive the up/down signal UP/DN and output a pre-lock signal PRELOCK based thereon. The pre-lock signal PRELOCK may be used to decide the time at which a lock signal LOCK is to be outputted.

The pre-lock signal generator 620 may include an edge detector 621, an edge counter 622, and a pre-lock signal output circuit 623.

The edge detector 621 may receive the up/down signal UP/DN. The edge detector 621 may detect that the up/down signal UP/DN change from a high state to a low state or from a low state to a high state. For example, the edge detector 621 may detect a falling edge at which the up/down signal UP/DN changes from a high state to a low state or a rising edge at which the up/down signal UP/DN changes from a low state to a high state, and may output an edge detection signal EDGE to the edge counter 622 whenever it detects a falling edge or a rising edge.

The edge counter 622 may receive the edge detection signal EDGE from the edge detector 621. The edge counter 622 may count the number of edge detection signals inputted thereto. The edge counter 622 may output an edge count signal E_CNT to the pre-lock signal output circuit 623 when the number of edge detection signals EDGE inputted thereto reaches a preset reference number. For example, the edge counter 622 may output the edge count signal E_CNT when the edge detection signal EDGE is inputted at least twice. It is noted, that in the embodiment of FIG. 7, the number of edge detection signals EDGE detected by the edge counter 622 in order for the edge count signal E_CNT to be outputted may be set to any desired number that is at least two.

The pre-lock signal output circuit 623 may receive the edge count signal E_CNT. The pre-lock signal output circuit 623 may generate a pre-lock signal PRELOCK in response to the edge count signal E_CNT and output the generated pre-lock signal PRELOCK to the lock signal generator 630.

Because the input signal IN changes over time, the high-to-low and low-to-high transition of the up/down signal UP/DN is repeated (bang-bang). The pre-lock signal generation circuit 620 has a structure for generating a pre-lock signal PRELOCK when a pre-determined number of repeated high-to-low and low-to-high transitions of the up/down signal UP/DN have occurred.

The lock signal generator 630 includes an N-bit counter 631, an N-bit register 632, an N−1-bit counter 633, and a lock signal output circuit 634. The elements in FIG. 7 are referred to as the N-bit counter 631, the N-bit register 632, and the N−1-bit counter 633 for the convenience of description, but the N-bit counter, the N-bit register, and the N−1-bit counter may be called a first counter, a register, and a second counter, respectively.

The N-bit counter 631 may receive the ambiguous signal AMBIG. The N-bit counter 631 may receive the ambiguous signal AMBIG based on a reference clock CLK, and may count the number of ambiguous signals AMBIG inputted thereto in units of bits from when the ambiguous signal AMBIG is first received to when the state of the up/down signal UP/DN changes. Here, the number ambiguous signals AMBIG may be the number of clocks while the ambiguous signal AMBIG is being inputted. The N-bit register 632 may store count data that indicates data counted in units of bits. For example, when the ambiguous signal AMBIG is inputted for three clocks, count data "11" acquired by counting the number of input clocks in units of bits may be stored in the N-bit register 632. When the ambiguous signal is inputted for four clocks, count data "100" may be stored in the N-bit register. In an embodiment the count data may be the number of changing codes while the ambiguous signal AMBIG is being inputted before the up/down signal UP/DN toggles.

The N-bit register 632 may output the least significant bit of the count data as dead-zone lower bit data DZ<0>. The N-bit register 632 may output more significant bits, excluding the least significant bit of the stored count data, as dead-zone upper bit data DZ<N−1:1> to the lock signal output circuit 634.

The N−1-bit counter 633 may receive the pre-lock signal PRELOCK. Although not illustrated, the N−1-bit counter 633 may receive count data from the N-bit counter 631. The N−1-bit counter 633 may receive the count data, which is the number of clocks counted by the N-bit counter 631 while the ambiguous signal AMBIG is being inputted, from when the pre-lock signal PRELOCK is inputted thereto, and may output rollback data RBK<N−2:0> that is a quotient of the count data divided by 2 to the lock signal output circuit 634.

The lock signal output circuit 634 may receive the dead-zone upper bit data DZ<N−1:1> from the N-bit register 632, and may receive the rollback data RBK<N−2:0> from the N−1-bit counter 633.

The lock signal output circuit 634 may compare the dead-zone upper bit data DZ<N−1:1> with the rollback data RBK<N−2:0>, and may output a lock signal LOCK when the dead-zone upper bit data DZ<N−1:1> is equal to the rollback data RBK<N−2:0>.

Figure 8:
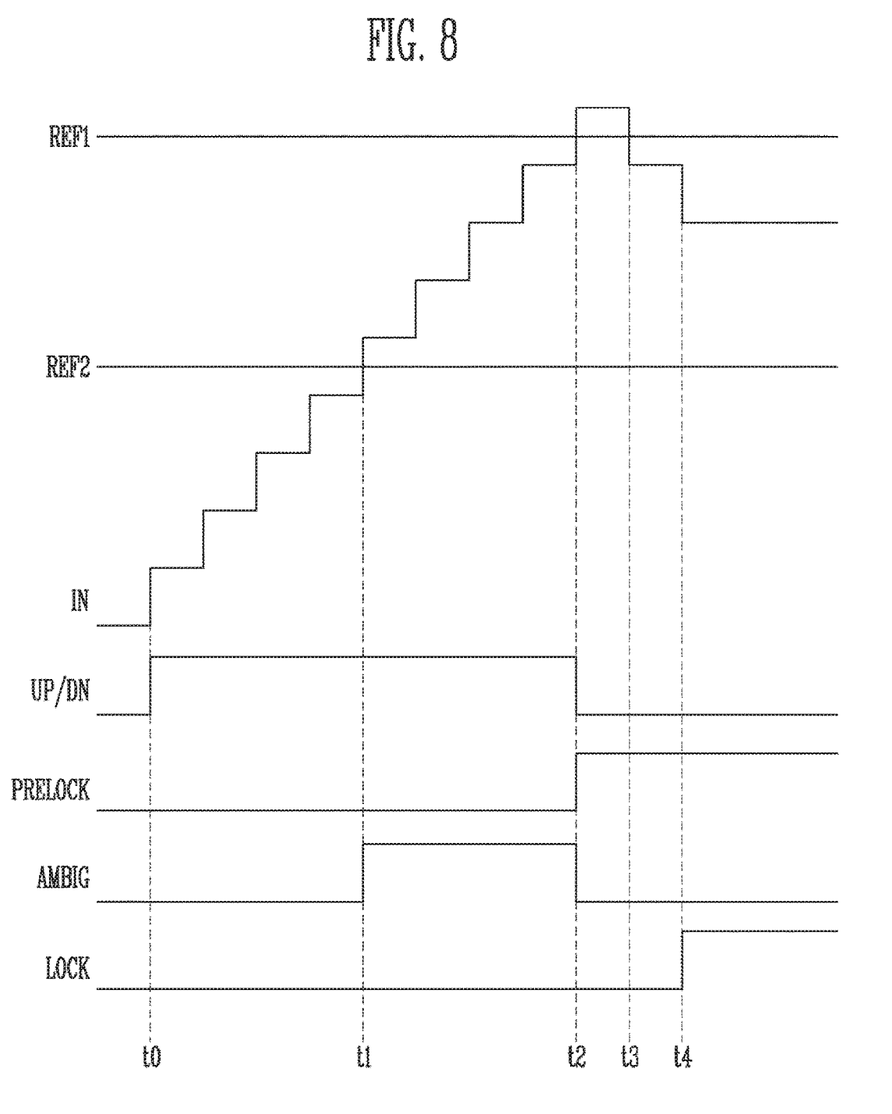
FIG. 8 is a timing diagram of an operation of the lock signal generation circuit shown in FIG. 7.

FIG. 8 is an exemplary timing diagram of an operation of the lock signal generation circuit in accordance with the embodiment of FIG. 7.

Referring to FIG. 8, an input signal IN is inputted at t0. At t0, the input signal IN has a lower level than the first reference signal REF1 and the second reference signal REF2. Accordingly, the comparator 611 may output an up/down signal UP/DN having a high state as the result of comparison of the input signal IN with the first reference signal REF1 and the second reference signal REF2.

The code signal generator 612, which receives the up/down signal UP/DN outputted by the comparator 611, may output an up-code signal as a code signal because the up/down signal UP/DN has the high state. The input signal IN may be adjusted so as to have a level that is 1 code higher than before in response to the up-code signal.

Because the input signal IN continues to have a lower level than the first reference signal REF1 and the second reference signal REF2 in the period from t0 to t1, the up/down signal UP/DN outputted by the comparator 611 maintains the high state. Also, because the code signal generator 612 outputs the up-code signal in response to the up/down signal UP/DN having the high state, the level of the input signal IN may increase by 1 code every time it gets updated during the period of t0 to t1.

At t1, the input signal IN has increased to a level that is higher than the level of the second reference signal REF2 and lower than the level of the first reference signal REF1. Accordingly, the comparator 611 may output an ambiguous signal AMBIG. Also, because the level of the input signal IN is higher than the level of the second reference signal REF2 but is lower than the level of the first reference signal REF1, the comparator 611 may output the up/down signal UP/DN having a high state that is the same as the previous state. In response to the up/down signal UP/DN having the high state, the code signal generator 612 may output an up-code signal. The input signal IN may be adjusted so as to have a level that is 1 code higher than before in response to the up-code signal.

From t1 to t2, the input signal IN has a level that is higher than the level of the second reference signal REF2 and lower than the level of the first reference signal REF1. Accordingly, the comparator 611 may continuously output the ambiguous signal AMBIG. The N-bit counter 631 counts the number of clocks while the ambiguous signal AMBIG is being inputted. In the embodiment of FIG. 8, the ambiguous signal AMBIG is being inputted for four clocks (not illustrated). While the ambiguous signal AMBIG is being inputted, the up/down signal UP/DN maintains the high state, which is the same as the previous state. Accordingly, the level of the input signal IN increases by a total of 4 codes during the period from t1 to t2.

At t2, the input signal IN has a higher level than the first reference signal REF1 and the second reference signal REF2. Accordingly, the comparator 611 may output an up/down signal UP/DN having a low state. In response to the up/down signal UP/DN having the low state, the code signal generator 612 may output a down-code signal. The input signal IN may be adjusted so as to have a level that is 1 code lower than before in response to the down-code signal. The edge detector 621 of the pre-lock signal generation unit 620 may detect a falling edge at which the high state is changed to a low state, and may output an edge detection signal EDGE to the edge counter 622. The edge counter 622 receives the edge detection signal EDGE in response to the rising edge at t0 and receives the edge detection signal EDGE in response to the falling edge at t2. Accordingly, because it receives the two edge detection signals EDGE, the edge counter 622 may output an edge count signal E_CNT to the pre-lock signal output circuit 623. The pre-lock signal output circuit 623 may output a pre-lock signal PRELOCK in response to the edge count signal E_CNT.

The N-bit counter 631 counts the number of clocks while the ambiguous signal AMBIG is being inputted from t1, at which the ambiguous signal AMBIG is first inputted, to t2, at which the state of the up/down signal UP/DN changes. Because four docks CLK (not illustrated) are being inputted from t1 to t2 during which the ambiguous signal AMBIG has a high state, the N-bit counter 631 may store count data corresponding to "100" in the N-bit register 632.

The N−1-bit counter 633 may output rollback data RBK<N−2:0> corresponding to a quotient of the count data divided by 2 to the lock-signal output unit 634 from t2 at which the pre-lock signal PRELOCK is inputted.

The N-bit register 632 may output "10" corresponding to 2, excluding the least significant bit of the count data "100", as dead-zone upper bit data DZ<N−1:1> to the lock-signal output unit 634.

Because the level of the input signal IN increases by 4 codes from t1 to t2, the lock signal LOCK must be outputted in the state the level of the input signal decreases by 2 codes corresponding to the half of the increased codes.

At t3, the input signal IN has a level that is higher than the level of the second reference signal REF2 and lower than the level of the first reference signal REF1. Accordingly, the up/down signal UP/DN maintains the low state, and a down-code signal may be outputted in response thereto. The level of the input signal IN may decrease by 1 code in response to the down-code signal.

At t4, the input signal IN has a level that is higher than the level of the second reference signal REF2 and lower than the level of the first reference signal REF1. Accordingly, the up/down signal UP/DN maintains the low state, and a down-code signal may be outputted in response thereto. The level of the input signal IN may decrease by 1 code in response to the down-code signal.

The lock signal output circuit 634 receives rollback data RBK<N−2:0> delayed for 2 codes from the N−1-bit counter 633 from the time at which the pre-lock signal PRELOCK is outputted. The lock signal output circuit 634 may output a lock signal LOCK from t4 at which the dead-zone upper bit data DZ<N−1:1> is equal to the rollback data RBK<N−2:0>.

Figure 9:
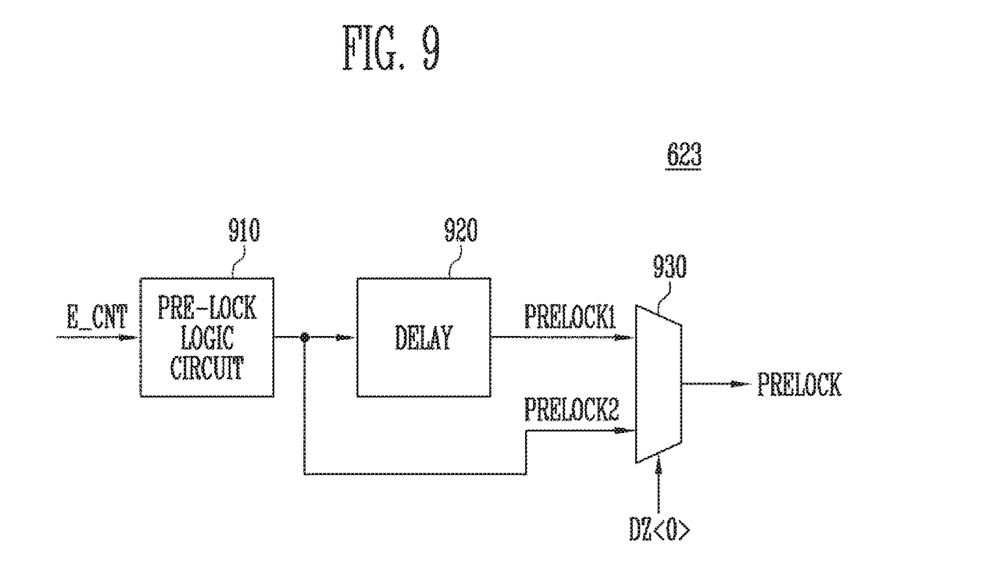
FIG. 9 is a diagram illustrating the pre-lock signal output circuit shown in FIG. 7.

FIG. 9 is a diagram for explaining the pre-lock signal output circuit 623 of FIG. 7.

Referring to FIG. 9, the pre-lock signal output circuit 623 may include a pre-lock logic circuit 910, a delay 920, and a multiplexer 930. The edge count signal E_CNT may be a signal for outputting the pre-lock signal by detecting the preset number of changes of the state of the up/down signal UP/DN.

In accordance with the embodiment of FIG. 9, the pre-lock logic circuit 910 outputs a second pre-lock signal PRELOCK2 to the delay 920 and the multiplexer 930 in response to the edge count signal E_CNT.

The delay unit 920 may output a first pre-lock signal PRELOCK1, acquired by delaying the second pre-lock signal PRELOCK2 for 1 cycle of the reference clock, to the multiplexer 930.

The multiplexer 930 may receive the least significant bit of the count data stored in the N-bit register 632 as dead-zone lower bit data DZ<0>, which has been described with reference to FIG. 7, and may output either the first pre-lock signal PRELOCK1 or the second pre-lock signal PRE-LOCK2 as the pre-lock signal PRELOCK.

For example, the multiplexer 930 may output the second pre-lock signal PRELOCK2 as the pre-lock signal PRE-LOCK when the dead-zone lower bit data DZ<0> is equal to '0', but may output the first pre-lock signal PRELOCK1 as the pre-lock signal PRELOCK when the dead-zone lower bit data DZ<0> is equal to '1'.

In accordance with the embodiment of FIG. 9, count data, acquired by counting the number of clocks in units of bits while the ambiguous signal AMBIG is being inputted from when the ambiguous signal AMBIG is first received to when the state of the up/down signal UP/DN changes, is either an even number or an odd number. When the count data is an even number, the dead-zone lower bit data DZ<0>, which is the least significant bit of the count data, may be '0'. When the count data is an odd number, the dead-zone lower bit data DZ<0> may be '1'. Accordingly, when the count data is an even number, the second pre-lock signal PRELOCK2, which is not delayed, may be outputted as the pre-lock signal PRELOCK, but when the count data is an odd number, the first pre-lock signal PRELOCK1, which is delayed, may be outputted as the pre-lock signal PRELOCK. Accordingly, the lock signal LOCK may be outputted when the level of the input signal IN changes by a number of codes corresponding to a rounded value of a quotient of the count data divided by 2.

The lock signal generation circuit 600, which was described with reference to FIGS. 6 to 9, uses the bang-bang lock detection method having been described in FIG. 2 and FIG. 3, but may be used as a detector circuit using two reference signals REF1 and REF2 in accordance with the embodiment having been described in FIG. 4 and FIG. 5. That is, an input signal is compared with two reference signals REF1 and REF2, and any one of three states, which are an up/down signal UP/DN indicating UP, the up/down signal UP/DN indicating DOWN, and an ambiguous signal AMBIG indicating an ambiguous state, may be outputted. Also, the lock-signal generation circuit 600 is configured such that the up/down signal UP/DN maintains the previous state value in the ambiguous state. The lock signal generation circuit 600 counts the number of codes before the up/down signal UP/DN toggles in the ambiguous state, and stores the counted number as count data. The lock signal generation circuit 600 may eliminate a dead zone by rolling back as many codes as the rounded value of a quotient of the count data divided by 2 from the time point at which the up/down signal UP/DN toggles.

The lock signal generation circuit 600 in accordance with an embodiment of the present disclosure may be applied to various digital feedback systems. For example, the lock signal generation circuit 600 may be applied to a phase-locked loop circuit, a delay-locked loop circuit or ZQ calibration circuit included in nonvolatile memory devices.

In accordance with the present disclosure, a feedback system, which is capable of eliminating a dead zone and has a reduced resolution error, and a method of operating the feedback system are provided.

Although specific embodiments have been described in the detailed description of the present disclosure, it should be apparent that various modifications can be made without deviating from the spirit or scope of the present disclosure. Therefore, the scope of the present disclosure should not be limited to the above-described embodiments, but should be defined by the appended claims as well as equivalents thereto.

As described above, although the present disclosure has been described by the limited embodiments and drawings, the present disclosure is not limited to the above-described embodiments. Those skilled in the art to which the present disclosure pertains can make various modifications and alterations from the above description.

Accordingly, the scope of the present disclosure should not be construed as being limited to the described embodiments, but should be defined by the appended claims as well as equivalents thereto.

In the above described embodiments, all of the steps may be selectively performed or omitted. Also, in each embodiment, the steps do not need to be performed in the sequential order as depicted, and they may be performed in a changed order. The embodiments of the present disclosure, which have been described in the specification with reference to the accompanying drawings, are to be regarded as examples illustrating the present disclosure, rather than in a restrictive sense. It is obvious to those skilled in the art to which the present disclosure pertains that various modifications and changes can be made based on the technical spirit in the specification.

Meanwhile, preferred embodiments of the present disclosure have been described and specific terms are used in the specification and the drawings, but these terms are used to help understand the present disclosure and are not intended to limit the scope of the present disclosure. It is obvious to those skilled in the art to which the present disclosure pertains that not only the above-described embodiments but also various modifications and changes based on the technical spirit of the present disclosure can be practiced.

What is claimed is:

1. A lock signal generation circuit, comprising:
    an input signal control circuit configured to receive an input signal and two reference signals and output state signals and a code signal for controlling a level of the input signal, the state signals representing a result of comparison of the input signal with the two reference signals, wherein the state signals include an up/down signal and an ambiguous signal;
    a pre-lock signal generator configured to receive the up/down signal, and to output a pre-lock signal to determine a time at which the level of the input signal is to be fixed in response to the up/down signal, wherein the up/down signal represents whether the input signal has a higher or lower level than the two reference signals; and
    a signal-processing circuit configured to receive the pre-lock signal and the ambiguous signal, and to output a lock signal to fix the level of the input signal using the ambiguous signal and the pre-lock signal, wherein the ambiguous signal is outputted when the level of the input signal is in between levels of the two reference signals.

2. The lock signal generation circuit according to claim 1, wherein:
    the two reference signals include a first reference signal and a second reference signal, and
    the first reference signal has a higher level than the second reference signal.

3. The lock signal generation circuit according to claim 2, wherein the input signal control unit comprises:
    a comparator configured to receive the input signal, the first reference signal, and the second reference signal, to output the up/down signal having a low state when the level of the input signal is lower than a level of the second reference signal, to output the up/down signal having a high state when the level of the input signal is higher than a level of the first reference signal, and to output the ambiguous signal when the level of the input signal is higher than the level of the second reference signal and lower than the level of the first reference signal; and
    a code signal generator configured to output an up-code signal for increasing the level of the input signal by 1 code as the code signal when the up/down signal has a low state, and to output a down-code signal for decreasing the level of the input signal by 1 code as the code signal when the up/down signal has a high state.

4. The lock signal generation circuit according to claim 3, wherein the comparator does not change a state of the up/down signal when the ambiguous signal is outputted.

5. The lock signal generation circuit according to claim 4, wherein the pre-lock signal generation unit comprises:
    an edge detector configured to output an edge detection signal by detecting that the state of the up/down signal changes;
    an edge counter configured to count the edge detection signal and to output an edge count signal when a preset number of edge detection signals are inputted; and
    a pre-lock signal output circuit configured to output the pre-lock signal using the edge count signal.

6. The lock signal generation circuit according to claim 5, wherein the signal-processing circuit is configured to:
    count a number of codes by which the level of the input signal increases or decreases from when the ambiguous signal is outputted to when the state of the up/down signal changes, and
    output the lock signal after the level of the input signal decreases or increases by a number of codes corresponding to a rounded value of a quotient of the counted number of codes divided by 2.

7. The lock signal generation circuit according to claim 6, wherein the signal-processing circuit comprises:
    a first counter configured to count a number of times the ambiguous signal is inputted from when the ambiguous signal is outputted to when the state of the up/down signal changes;
    a register configured to store count data indicative of the number of times the ambiguous signal is inputted, which is counted by the first counter;
    a second counter configured to receive the pre-lock signal and to output rollback data acquired by delaying the pre-lock signal for a quotient of the count data divided by 2; and
    a lock signal output circuit configured to output the lock signal by comparing the rollback data with dead-zone upper bit data, which is the count data from which a least significant bit thereof is excluded.

8. The lock signal generation circuit according to claim 7, wherein the edge counter is configured to output the edge count signal when the edge detection signal is inputted twice.

9. The lock signal generation circuit according to claim 8, wherein the pre-lock signal output circuit comprises:
    a pre-lock logic circuit configured to output a second pre-lock signal in response to the edge count signal;
    a delay configured to output a first pre-lock signal acquired by delaying the second pre-lock signal for a time period during which a level corresponding to the 1 code is changed; and
    a multiplexer configured to receive the first pre-lock signal and the second pre-lock signal and to output any one of the first pre-lock signal and the second pre-lock signal as the pre-lock signal depending on dead-zone lower bit data, which is the least significant bit of the count data.

10. The lock signal generation circuit according to claim 9, wherein the multiplexer is configured to output the second pre-lock signal as the pre-lock signal when the dead-zone lower bit data is equal to 0, and to output the first pre-lock signal as the pre-lock signal when the dead-zone lower bit data is equal to 1.

11. A feedback system, comprising:
an input signal generation circuit configured to output an input signal having a level corresponding to a code signal inputted thereto; and
a lock signal generation circuit configured to output the code signal for controlling a level of the input signal using two reference signals, to generate count data acquired by counting a number of clock signals from when the level of the input signal reaches between levels of the two reference signals to when the level of the input signal becomes higher or lower than any one of the two reference signals, and to output a lock signal as a control signal to fix the level of the input signal after a time period elapses, wherein the time period corresponds to a rounded value of a quotient of the count data divided by 2.

12. The feedback system according to claim 11, wherein the lock signal generation circuit comprises:
an input signal control circuit configured to output the code signal and state signals indicative of a result of comparison of the input signal with the two reference signals, wherein the state signals include an up/down signal and an ambiguous signal;
a pre-lock signal generator configured to receive the up/down signal, and to output a pre-lock signal to determine a time at which the level of the input signal is to be fixed in response to the up/down signal, wherein the up/down signal represents whether the input signal has a higher or lower level than the two reference signals; and
a signal-processing circuit configured to receive the pre-lock signal and the ambiguous signal and to output the lock signal through which control is performed so as to fix the level of the input signal using the ambiguous signal and the pre-lock signal, wherein the ambiguous signal is outputted when the level of the input signal is in between the levels of the two reference signals.

13. The feedback system according to claim 12, wherein:
the two reference signals include a first reference signal and a second reference signal,
the first reference signal has a higher level than the second reference signal, and
the input signal control circuit comprises:
a comparator configured to receive the input signal, the first reference signal, and the second reference signal, to output the up/down signal having a low state when the level of the input signal is lower than a level of the second reference signal, to output the up/down signal having a high state when the level of the input signal is higher than a level of the first reference signal, and to output the ambiguous signal when the level of the input signal is higher than the level of the second reference signal and lower than the level of the first reference signal; and
a code signal generator configured to output an up-code signal for increasing the level of the input signal by 1 code as the code signal when the up/down signal has a low state, and to output a down-code signal for decreasing the level of the input signal by 1 code as the code signal when the up/down signal has a high state.

14. The feedback system according to claim 13, wherein the comparator does not change a state of the up/down signal when the ambiguous signal is outputted.

15. The feedback system according to claim 14, wherein the pre-lock signal generation unit comprises:
an edge detector configured to output an edge detection signal by detecting that the state of the up/down signal changes;
an edge counter configured to count the edge detection signal and to output an edge count signal when a preset number of edge detection signals are inputted; and
a pre-lock signal output circuit configured to output the pre-lock signal using the edge count signal.

16. The feedback system according to claim 15, wherein the signal-processing circuit is configured to:
count a number of codes by which the level of the input signal increases or decreases from when the ambiguous signal is outputted to when the state of the up/down signal changes, and
output the lock signal after the level of the input signal decreases or increases by a number of codes corresponding to a rounded value of a quotient of the counted number of codes divided by 2.

17. The feedback system according to claim 16, wherein the signal-processing circuit comprises:
a first counter configured to count a number of times the ambiguous signal is inputted from when the ambiguous signal is outputted to when the state of the up/down signal changes;
a register configured to store count data indicative of the number of times the ambiguous signal is inputted, which is counted by the first counter;
a second counter configured to receive the pre-lock signal and to output rollback data acquired by delaying the pre-lock signal for a quotient of the count data divided by 2; and
a lock signal output circuit configured to output the lock signal by comparing the rollback data with dead-zone upper bit data, which is the count data from which a least significant bit thereof is excluded.

18. The feedback system according to claim 17, wherein the edge counter is configured to output the edge count signal when the edge detection signal is inputted twice.

19. The feedback system according to claim 18, wherein the pre-lock signal output circuit comprises:
a pre-lock logic unit configured to output a second pre-lock signal in response to the edge count signal;
a delay unit configured to output a first pre-lock signal acquired by delaying the second pre-lock signal for a time period during which a level corresponding to the 1 code is changed; and
a multiplexer configured to receive the first pre-lock signal and the second pre-lock signal and to output any one of the first pre-lock signal and the second pre-lock signal as the pre-lock signal depending on dead-zone lower bit data, which is the least significant bit of the count data.

20. The feedback system according to claim 19, wherein the multiplexer is configured to output the second pre-lock signal as the pre-lock signal when the dead-zone lower bit data is equal to 0, and to output the first pre-lock signal as the pre-lock signal when the dead-zone lower bit data is equal to 1.

* * * * *

UNITED STATES PATENT AND TRADEMARK OFFICE
CERTIFICATE OF CORRECTION

PATENT NO. : 10,483,955 B2
APPLICATION NO. : 16/030013
DATED : November 19, 2019
INVENTOR(S) : Dong Hyun Kim et al.

It is certified that error appears in the above-identified patent and that said Letters Patent is hereby corrected as shown below:

In the Claims

In Column 19, Line 62, in Claim 3, please replace the word [[low]] with the word --high--.
In Column 19, Line 65, in Claim 3, please replace the word [[high]] with the word --low--.
In Column 20, Line 7, in Claim 3, please replace the word [[low]] with the word --high--.
In Column 20, Line 9, in Claim 3, please replace the word [[high]] with the word --low--.
In Column 21, Line 52, in Claim 13, please replace the word [[low]] with the word --high--.
In Column 21, Line 55, in Claim 13, please replace the word [[high]] with the word --low--.
In Column 21, Line 64, in Claim 13, please replace the word [[low]] with the word --high--.
In Column 21, Line 66, in Claim 13, please replace the word [[high]] with the word --low--.

Signed and Sealed this
Twelfth Day of July, 2022

Katherine Kelly Vidal
*Director of the United States Patent and Trademark Office*